(12) United States Patent
Felix et al.

(10) Patent No.: US 11,449,117 B2
(45) Date of Patent: Sep. 20, 2022

(54) REACTIVE DROOP LIMITER

(71) Applicant: Graphcore Limited, Bristol (GB)

(72) Inventors: Stephen Felix, Bristol (GB); Daniel Wilkinson, Bristol (GB)

(73) Assignee: GRAPHCORE LIMITED, Bristol (GB)

( * ) Notice: Subject to any disclaimer, the term of this patent is extended or adjusted under 35 U.S.C. 154(b) by 93 days.

(21) Appl. No.: 16/842,859

(22) Filed: Apr. 8, 2020

(65) Prior Publication Data

US 2021/0191488 A1 Jun. 24, 2021

(30) Foreign Application Priority Data

Dec. 23, 2019 (GB) ...................................... 1919151

(51) Int. Cl.
*G06F 1/30* (2006.01)
*G06F 1/08* (2006.01)
*G06F 1/3206* (2019.01)

(52) U.S. Cl.
CPC ................ *G06F 1/305* (2013.01); *G06F 1/08* (2013.01); *G06F 1/3206* (2013.01)

(58) Field of Classification Search
CPC ........... G06F 1/305; G06F 1/08; G06F 1/3206
See application file for complete search history.

(56) References Cited

U.S. PATENT DOCUMENTS

| | | | |
|---|---|---|---|
| 4,344,036 A | 8/1982 | Dakroub | |
| 9,503,068 B1 | 11/2016 | DiBene | |
| 10,348,281 B1* | 7/2019 | Oliver | H03K 19/00369 |
| 10,587,253 B1* | 3/2020 | Huang | G06F 1/305 |

(Continued)

FOREIGN PATENT DOCUMENTS

| | | |
|---|---|---|
| CN | 103516210 A | 1/2014 |
| WO | 2015126790 A1 | 8/2015 |
| WO | 2018048550 A1 | 3/2018 |

OTHER PUBLICATIONS

Combined Search and Examination Report dated May 28, 2020 for Patent Application No. GB1919151.9.
(Continued)

*Primary Examiner* — Gary Collins
(74) *Attorney, Agent, or Firm* — Haynes and Boone, LLP

(57) ABSTRACT

During normal operation of a processor, voltage droop is likely to occur and there is, therefore, a need for techniques for rapidly addressing this droop so as to reduce the probability of circuit timing failures. This problem is addressed by provided an apparatus that is configured to detect the droop and react to mitigate the droop. The apparatus includes a frequency divider that is configured to receive an output of a clock signal generator (e.g. a phase locked loop) and produce an output signal in which a predefined fraction of the clock pulses in the output of the clock signal generator are removed from the output signal. By reducing the frequency of the clock signal in this way (as may be understood by examining equation 3) $V_{DD}$ is increased, hence mitigating the voltage droop. This technique provides a fast throttling mechanism that prevents excessive $V_{DD}$ droop across the processor.

20 Claims, 8 Drawing Sheets

(56) References Cited

U.S. PATENT DOCUMENTS

| | | | | |
|---|---|---|---|---|
| 2003/0112038 | A1* | 6/2003 | Naffziger | G06F 1/10 |
| | | | | 327/100 |
| 2004/0183613 | A1* | 9/2004 | Kurd | G01R 31/275 |
| | | | | 331/186 |
| 2011/0241423 | A1* | 10/2011 | Bridges | G06F 1/305 |
| | | | | 307/31 |
| 2015/0198966 | A1* | 7/2015 | Lee | G06F 1/324 |
| | | | | 713/501 |
| 2015/0355671 | A1 | 12/2015 | Coutts | |
| 2016/0033576 | A1 | 2/2016 | Turullols | |
| 2016/0291625 | A1* | 10/2016 | Tripathi | G05F 3/02 |
| 2017/0038789 | A1* | 2/2017 | Pal | G06F 1/08 |
| 2017/0038814 | A1* | 2/2017 | Pal | G06F 1/3237 |
| 2017/0177055 | A1* | 6/2017 | Whatmough | G06F 1/08 |
| 2017/0261537 | A1* | 9/2017 | Chong | G01R 31/3004 |
| 2017/0301381 | A1 | 10/2017 | Seomun | |
| 2017/0329391 | A1 | 11/2017 | Jaffari | |
| 2017/0344102 | A1* | 11/2017 | Kolla | H02M 1/08 |
| 2018/0018009 | A1* | 1/2018 | Kommrusch | G06F 1/324 |
| 2018/0091125 | A1* | 3/2018 | Carlson | H03K 5/19 |
| 2018/0232043 | A1 | 8/2018 | DiBene, II | |
| 2018/0246557 | A1* | 8/2018 | John | G06F 1/324 |
| 2020/0028514 | A1* | 1/2020 | Hanke | G06F 1/28 |
| 2020/0089299 | A1* | 3/2020 | Kim | H03L 7/097 |
| 2021/0089073 | A1* | 3/2021 | Lenzen | H03L 7/0818 |

OTHER PUBLICATIONS

International Search Report and Written Opinion dated Feb. 10, 2021 for PCT/EP2020/081632.

Office Action dated Jun. 22, 2022 for Chinese application No. 202080045313.2.

* cited by examiner

REACTIVE DROOP LIMITER

CROSS-REFERENCE TO RELATED APPLICATIONS

The present application claims priority to United Kingdom Patent Application No. 1919151.9, filed on Dec. 23, 2019, which is hereby incorporated by reference in its entirety.

TECHNICAL FIELD

The present disclosure relates to a method and apparatus for reactively limiting voltage droop.

BACKGROUND

During operation, a supply voltage is applied to a processor to power the operation of the logic circuits within the processor. The voltage supplied across the processor is referred to as $V_{DD}$. When executing one or more applications on the processor, there are different variables that can affect the voltage drawn by the processor during operation. Such factors include the effective switched capacitance of the processor, and the frequency at which the processor is clocked at. Specifically, it is understood that the impedance, Z, across a processor is related to the effective switched capacitance, $C_S$, and the processor clock frequency, f, by $$Z \propto \frac{1}{C_s f} \qquad \text{Equation 1}$$

In a circuit including a power supply and a processor, the processor is not the only source of impedance. The processor is also in series with other sources of impedance, such as, for example, impedance resulting from the internal resistance of the power supply. The processor is, therefore, part of a voltage divider in which the voltage, $V_{DD}$ across the processor varies with its impedance according to:

$$V_{DD} \propto Z \qquad \text{Equation 2}$$

Therefore, considering equations 1 and 2 together, it is seen that:

$$V_{DD} \propto \frac{1}{C_s f} \qquad \text{Equation 3}$$

Therefore, $V_{DD}$ will rise or fall with changes in the effective switched capacitance and the clock frequency of the processor. These variables will typically not remain constant over the operation of the processor. Therefore, unless the power supply voltage is adjusted to compensate, $V_{DD}$ will vary over the operation of the processor. When changes to $C_s$ and f occur slowly, it is possible to adjust the output of the power supply to keep $V_{DD}$ above a minimum required level. However, sudden increases in $C_s$ or f can cause $V_{DD}$ to droop suddenly. Such voltage droop may result in timing failures in the processor, which could be fatal for the operation of the processor.

Sudden increases in the processor clock frequency may be caused, for example, by a switch from use of a slow phase locked loop (PLL) to use of a fast phase locked loop (PLL). Such a switch may be performed, for example, to execute an application faster and enable it to deliver its output faster. However, due to the inverse relationship between $V_{DD}$ and the clock frequency, a sudden increase in the clock frequency can cause $V_{DD}$ to droop suddenly.

Such increases in the effective switched capacitance may be caused by a change in application behaviour. This may, particularly, be seen in a processor having a large number of execution units, in which certain events in the processor, such as a synchronisation of data between memories associated with different units, can result in computationally intensive code being executed by the units. An increase in the amount of computationally intensive code results in an increase in the number of switching elements in the processor that are switched every clock cycle. This increase in the amount of switching increases the effective switching capacitance, thus causing a decrease in $V_{DD}$.

SUMMARY

For the reasons identified above, during normal operation of a processor, voltage droop is likely to occur. The effect of the droop may cause circuit timing failures. Furthermore, in some cases, the droop may reduce power efficiency (and, therefore, performance) by causing $V_{DD}$ to be raised to prevent circuit timing failures.

A large current step can cause $V_{DD}$ to droop very quickly. The total droop in the voltage may take place over the course of 300 ns. During this time, a power controller that supplies the voltage may respond to the droop by increasing its output voltage so as to mitigate the droop. Since the power controller is limited by the time in which it can respond to the droop by raising $V_{DD}$, the majority of the remaining droop (approximately 70%) may occur in the first 15 ns, which is before the power controller is able to respond. There is a need for a solution that addresses this early droop rapidly.

Embodiments address this problem by providing an apparatus that is configured to detect the droop and react to mitigate the droop. The apparatus includes a frequency divider that is configured to receive an output of a clock signal generator (e.g. a phase locked loop) and produce an output signal in which a predefined fraction of the clock pulses in the output of the clock signal generator are removed from the output signal. By reducing the frequency of the clock signal in this way $V_{DD}$ is increased, hence mitigating the voltage droop. This technique provides a fast throttling mechanism that prevents excessive $V_{DD}$ droop across the processor.

According to a first aspect, there is provided a method of controlling the frequency of a clock signal for a processor, the method comprising: receiving from a clock generator, a first processor clock signal for supplying to a processor, the first processor clock signal being of a first frequency; receiving an indication of voltage droop in a voltage supplied to the processor; in response to the indication of the voltage droop, removing a proportion of clock pulses from the first processor clock signal to generate a second processor clock signal of a second frequency, wherein the second frequency is lower than the first frequency; and providing the second processor clock signal to the processor.

In some embodiments, the step of detecting voltage droop in the supply voltage comprises using a tap sampled delay line to measure a change in a clock edge position of the first clock signal in the tap sampled delay line, wherein the tap sampled delay line is powered by a same power supply that supplies the voltage to the processor. This provides a low cost technique for detecting voltage droop.

In some embodiments, the method comprises, following the step of removing the proportion of clock pulses from the first processor clock signal, adjusting the second processor clock signal so as to increase the second frequency, the adjusting the second processor clock signal comprising decreasing the proportion of clock pulses removed from the first processor clock signal. This allows the performance of the processor to be increased after the rapid initial droop mitigation.

BRIEF DESCRIPTION OF DRAWINGS

For a better understanding of the present disclosure and to show how the same may be carried into effect, reference will now be made to the accompanying drawings in which.

DETAILED DESCRIPTION

Proposals for addressing voltage droop can be divided into two categories: preventative and reactive. Preventative methods involve attempts at preventing the processor from entering a high power state too rapidly. One preventative proposal is to require the cores on a multicore chip to send requests to enter various higher power states to a central controller of the chip. The central controller may then grant them permission to enter those states in a time-staggered manner in order to limit the abruptness of the resulting current step. Since the current step is less abrupt, the power manager has time to raise its supply voltage to adapt to the changing conditions to limit the voltage droop that occurs. However, it is non-trivial for cores to predict accurately and reliably their future power consumption and also non-trivial to build a low-latency interconnect to the controller.

Reactive methods may involve allowing the load steps to occur, but then detecting and curtailing the voltage droop. This may have the advantage of not requiring any load prediction mechanism, and in some instances may be invoked only when necessary to curtail the droop. The challenge is, how to very rapidly respond to droop when it occurs. Since a large proportion of the droop occurs over a very short time frame (e.g. 15 ns), it may be desirable to curtail the droop as rapidly as possible.

Embodiments provide a reactive method for rapidly curtailing the voltage droop

Figure 1:
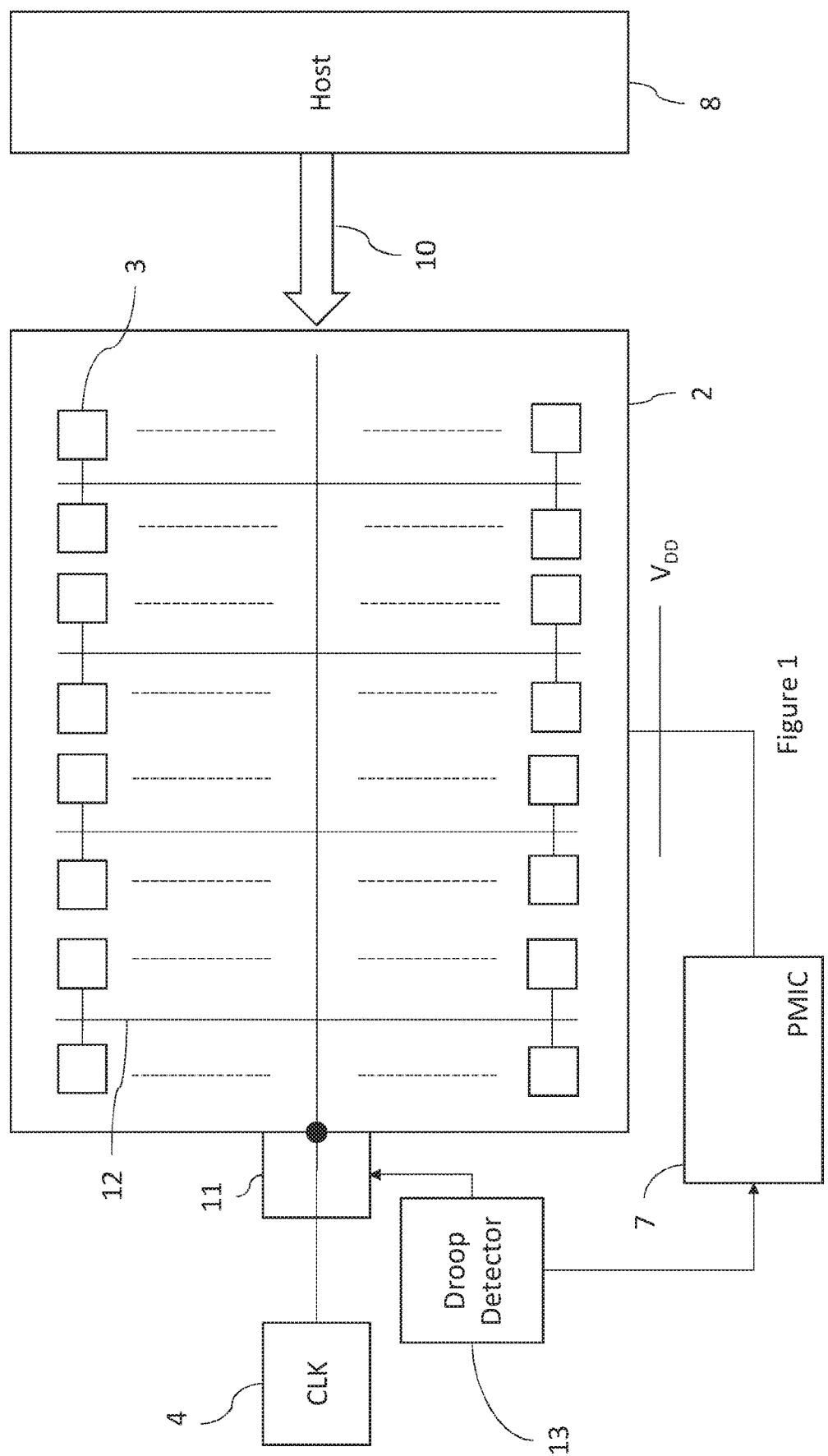
FIG. 1 provides a schematic illustration of a processor with a clock control system for mitigating droop.

FIG. 1 is a schematic block diagram of a computer system, which comprises a processor 2 which may, for example, be a single chip processor comprising multiple processing units (tiles) 3. The processor 2 may be an accelerator which is used to process workloads allocated to it by a host 8. The host 8 can supply workload data to the processor 2 via an interface 10. There may be a single processor 2, or multiple processors connected on a card and multiple cards in a rack. The processor 2 may be of the type known as an intelligence processor unit (IPU), which is designed to deal with workloads in the field of artificial intelligence or machine learning.

The tiles 3, in the example, are shown arranged in columns. Each of the tiles 3 is connected to a copper wire 12, which provides the clock signal to each of the tiles 3. The copper wire 12 provides a clock tree for the processor 2. The copper wire 12 is selected to be between 0.2 micrometres and 2 micrometres in thickness. The copper wire 12 may, for example, be 1 micrometre thick. The copper wire 12 may be 0.5 micrometres wide. The high thickness of the copper wire 12 reduces the insertion delay of the clock signal, and allows the clock signal to propagate to each of the tiles 3 very rapidly. Having a low insertion delay may be advantageous when modifying the clock signal so as to mitigate the droop, since a low insertion delay reduces the amount of time before modifications made to the frequency of the clock signal will take effect at the receiving tiles 3. The insertion delay for such a processor 2 may be approximately 3 nanoseconds.

Furthermore, the thickness of the coper wires 12 allows them to provide an additional function of providing structural support for the processor 2. Hence, the thick copper wires 12 have the dual function of propagating the clock signal and of providing structural support.

Although the processor 2 is shown as a multi-tile processor, in other embodiments, the processor 2 may take different forms. The tiles 3 shown in processor 2 could be other types of components that are clocked by the clock signal, instead of being individual processing units.

The clock signal for the processor 2 is provided by a clock source 4, which provides a clock signal at a first frequency to the processor 2. This clock signal is termed the 'first clock signal'. The clock source 4 comprises one or more phase locked loops (Pas) that provide the first clock signal. The one or more phase locked loops may comprise a plurality, e.g. two, PLLs. The clock source 4 may be configured to alternate between providing, as the first clock signal, an output of a first PLL (which provides a clock signal of a higher clock speed) and an output of a second PLL (which provides a clock signal of a lower clock speed). The first clock signal provided to the processor 2 may be provided to additional processors as well as processor 2. As an alternative to the clock being supplied via a card connector or similar, there may be an on-board clock source. That is, the clock 4 may be implemented within the processor 2

The clock source 4 provides the first clock signal to the droop mitigation circuit 11. When in normal operation, the droop mitigation circuit 11 passes the first clock signal through to the processor 2 without modifying the frequency. When droop occurs, the droop mitigation circuit 11 modifies the first clock signal to produce a second clock signal with a different frequency. The first clock signal is modified by removing a proportion of the clock pulses (e.g. 1 in 3) to produce the second clock signal. That is, the droop mitigation circuit 11 'eats' a proportion of the clock pulses of the first clock signal to produce the second clock signal.

The droop mitigation circuit 11 is configured to receive from a droop detector 13, an indication of voltage droop. The droop mitigation circuitry 11 responds to this indication of voltage droop by modifying the first clock signal to produce the second clock signal. Different possibilities exist as to how the droop detector 13 operates to detect the droop.

The droop detector 13 may operate by measuring the power supply voltage directly. Alternatively, the droop detector 13 may operate by measuring a change in the position of an edge of the first clock signal in a detecting apparatus. The change in position of the edge results from the voltage droop and, therefore, provides an indication of the voltage droop.

A power management integrated circuit (PMIC) 7 provides power to the processor 2 through a supply rail. The supply voltage provided at the processor 2 is labelled as $V_{DD}$. The PMIC 7 may also receive an input from the droop detector 13, which indicates to the PMIC 7, the droop in $V_{DD}$. In some cases, the PMIC 7 responds to this indication by raising its output voltage so as to increase $V_{DD}$. This mitigates the droop more slowly than the clock pulse removing process performed by droop mitigation circuit 11, and, furthermore, may reduce power efficiency. However, if the PMIC 7 increases its output voltage, this may allow the frequency of the clock signal to be raised again to increase the execution speed of the processor, whilst still keeping $V_{DD}$ above an acceptable level.

Figure 2:
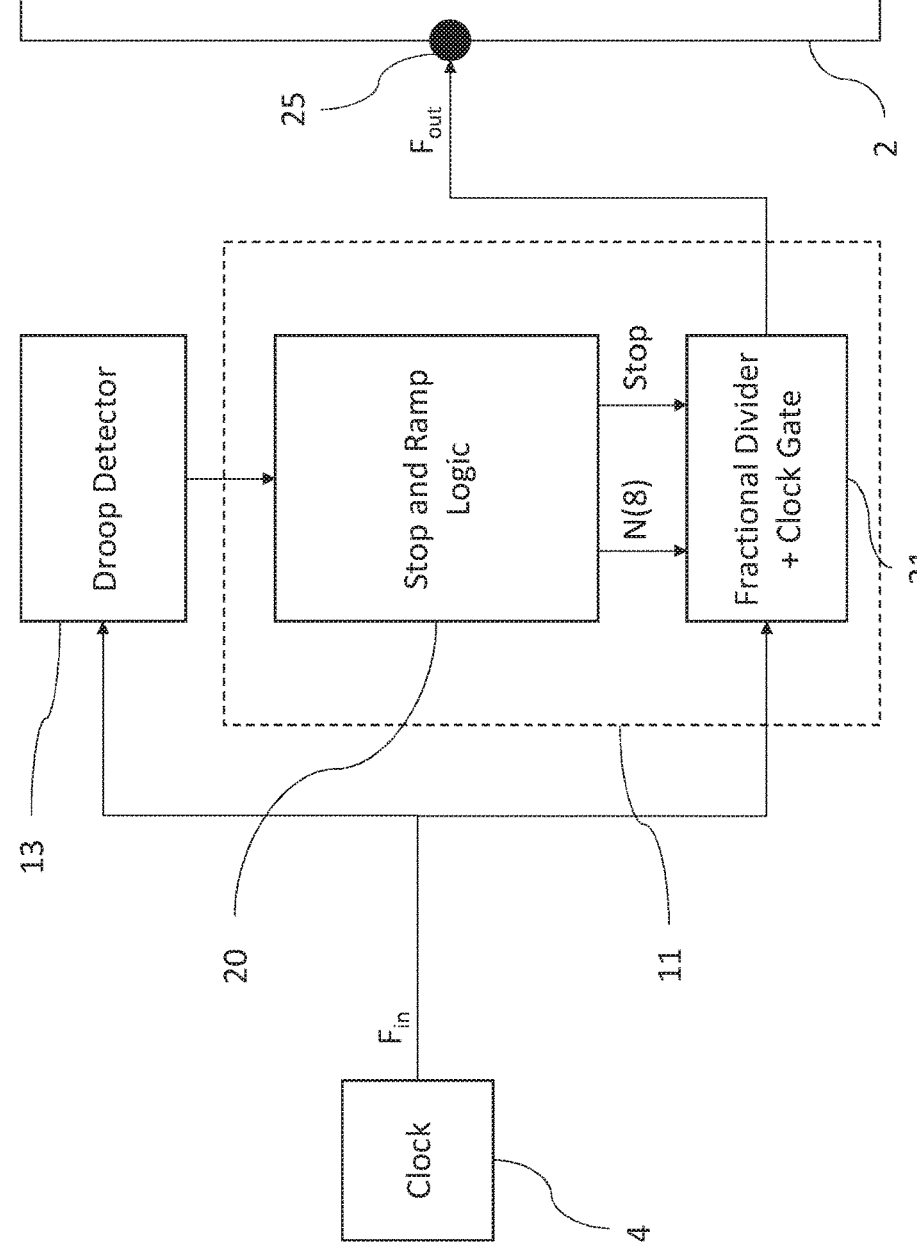
FIG. 2 provides a schematic illustration of the droop detection and mitigation circuitry in which droop is detected by measuring the change in position of a clock signal edge.

Reference is made to FIG. 2, which illustrates in more detail, the droop mitigation circuit 11 and droop detector 13. In this example, the droop detector 13 uses the first clock signal to detect the droop by measuring a change in a clock edge position of the first clock signal. The droop mitigation circuitry 11 comprises stop and ramp logic 20 and circuitry 21. The circuitry 21 provides a fractional dividing function, in which a portion of the clock pulses are removed from the first clock signal, and a clockgating function, in which the first clock signal is blocked for a predefined number of clock pulses. The stop and ramp logic 20 may otherwise be referred to as a 'controller'. The circuitry 21 may be referred to as 'clock signal modification circuitry'.

During normal operation, prior to the detection of droop rising above a threshold level, the first clock signal passes through the circuitry 21 and is provided to the processor 2 without modification by the circuitry 21. In normal operation, therefore, the second clock signal may be said to have the same frequency as the first clock signal.

The droop detector 13 issues an indication of droop to the stop and ramp logic 20. The stop and ramp logic 20 determines whether this droop has exceeded a threshold. If the stop and ramp logic 20 determines that the level of detected droop exceeds the threshold, it signals the circuitry 21, which responds by performing mitigating action.

As a first, optional mitigating step, the stop and ramp logic 20 issues a stop signal to the circuitry 21. The circuitry 21, in response to the stop signal, blocks the clock signal from being sent to the processor 2. The clock signal is blocked for a predefined number of clock pulses. The predefined number of clock pulses depends upon the insertion delay of the processor 2. The circuitry 21 blocks the clock signal for an amount of time that approximately matches the insertion delay of the processor 2. Matching the insertion delay of the processor 2 in this manner allows the clock to be restarted once the droop mitigation provided by stopping the clock starts to take effect. Stopping the clock mitigates the droop by causing the impedance of the processor 2 to rise, hence increasing the potential difference $V_{DD}$ across the processor 2. After the clock has been blocked for a predefined number of pulses, the stop and ramp logic 20 withdraws the stop signal, and the circuitry 21 unblocks the clock signal in response, so that clock pulses are again provided to processor 2.

The stop and ramp logic 20, provides to the circuitry 21, an indication of a proportion of the clock pulses that should be removed from the first clock signal to produce the second clock signal. The circuitry 21, in response to the indication of the proportion of clock signals that should be removed, removes the proportion of clock pulses in the first signal to produce the lower frequency second clock signal. Therefore, when the clock signal is unblocked following the first step, the unblocked clock signal is provided at a lower frequency.

The indication of the proportion of clock signal to be removed from the first clock signal comprises an 8-bit number shown as N(8) in FIG. 2. This number, N, indicates that a proportion of clock signals is to be removed such that:

$$F_{out} = \frac{N}{256} F_{in} \qquad \text{Equation 3}$$

where $F_{out}$ is the frequency of the second clock signal, and $F_{in}$ is the frequency of the first clock signal. The indication of the proportion of clock pulses to be removed may, for example, be such that 1 in every 3 clock pulses are removed by circuitry 21.

Figure 4:
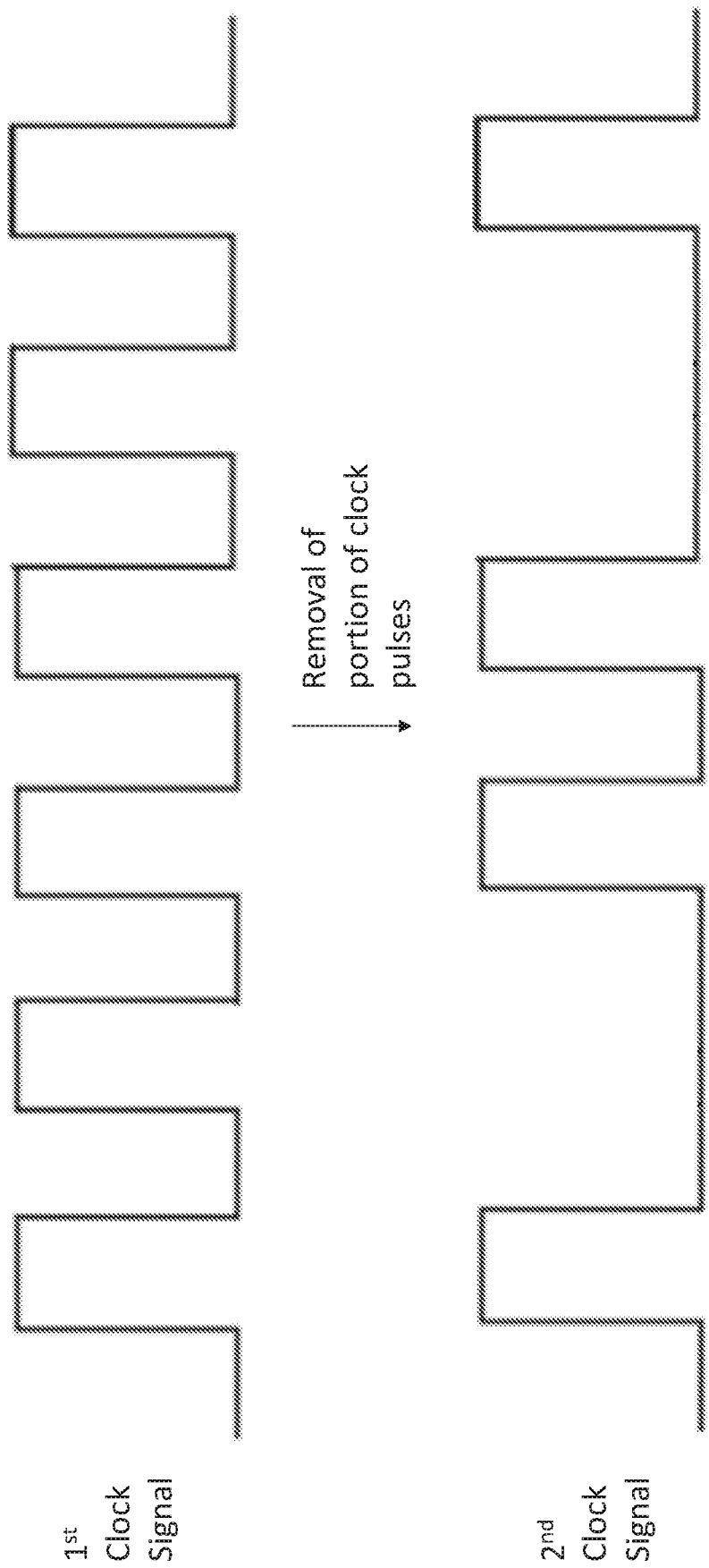
FIG. 4 shows an example modification made to the clock signal to reduce the frequency.

Reference is made to FIG. 4, which illustrates how the second clock signal may be related to the first clock signal. As shown in FIG. 4, after modification by the circuitry 21, the second clock signal is produced with one out of every three clock pulses of the first clock signal removed. As is understood from the Figure, removal of the clock pulses means that the signal remains low (i.e. 0) at the time of the removed clock pulses.

The indication of droop that is provided by the droop detector 13 comprises an indication of the magnitude of the droop. This indication of the magnitude of the droop is provided to the stop and ramp logic 20. The stop and ramp logic 20 receives the indication of magnitude of the droop, and in dependence upon the magnitude of the droop determines the proportion of clock pulses to be removed from the first clock signal. The proportion of clock pulses to be removed is selected to be proportional to the magnitude of the detected droop.

Following the setting of the circuitry 21 to remove a portion of the clock pulses from the first clock signal, the droop mitigation circuitry 11 starts to decrease the proportion of clock pulses removed from the first clock signal. In other words, the frequency of the second clock signal is gradually increased. This is performed by the stop and ramp logic gradually increasing the value of N that is signalled to the circuitry 21, such that the circuitry 21 gradually removes a smaller proportion of the clock signals from the first clock signal. Raising the frequency in this manner may be desirable, so as to allow applications executing on the processor 2 to execute faster.

The raising of the frequency may be carried out responsive to updated measurements carried out by the droop detector 13 as to the magnitude of the droop. Indications of the magnitude of the droop may periodically be provided to stop and ramp logic 20 by the droop detector 13.

When the circuitry 21 initially reduces the frequency of the second clock signal following detection of the droop, the frequency of the second clock signal may be held at this lower level until the droop detector 13 indicates a magnitude of the droop that does not exceed a threshold defined by the stop and ramp logic 20. In response to the determination that the droop does not exceed the threshold, the stop and ramp logic 20 then starts to reduce the proportion of the clock pulses removed from the first clock signal. The stop and ramp logic 20 continues to reduce the proportion of the clocks pulses removed from the first clock signal as long as the magnitude of the droop remains above the threshold. Hence, the frequency is gradually increased to a higher level as long as the droop remains below a threshold level. The stop and ramp logic 20 reduces the proportion of the clock pulses removed from the first clock signal by sending updated values of the variable, N, to the circuitry 21. The circuitry 21 responds by removing a smaller proportion of the clock pulses from the first clock signal. Eventually, if the droop remains above the threshold, the frequency of the second clock signal will equal the frequency of the first clock signal.

There are different variables stored in the stop and ramp logic 20 that affect its operation in controlling the droop. These variables may be adjustable as appropriate. One such variable is the droop threshold. If the droop rises above this threshold, the droop mitigation action will be carried out. If the droop falls below this threshold, the proportion of clock pulses removed will be reduced as long as the droop remains below the threshold. Another one of the variables is the number of clock pulses to be blocked when taking the first mitigating action discussed above. Another of the variables is the rate at which the clock frequency is increased (i.e. by reducing the number of removed clock pulses) following the mitigating action.

The droop detector 13 and droop mitigation circuitry 11 are positioned at the entry point 25 of the processor 2, which receives the clock signal. By positioning the detector 13 and circuitry 11 at the entry point 25, it is ensured the modified clock signal is applied to each of the components of the processor 2, whilst also minimising the time between the signal being modified and the modified signal reaching the processor components.

Figure 3:
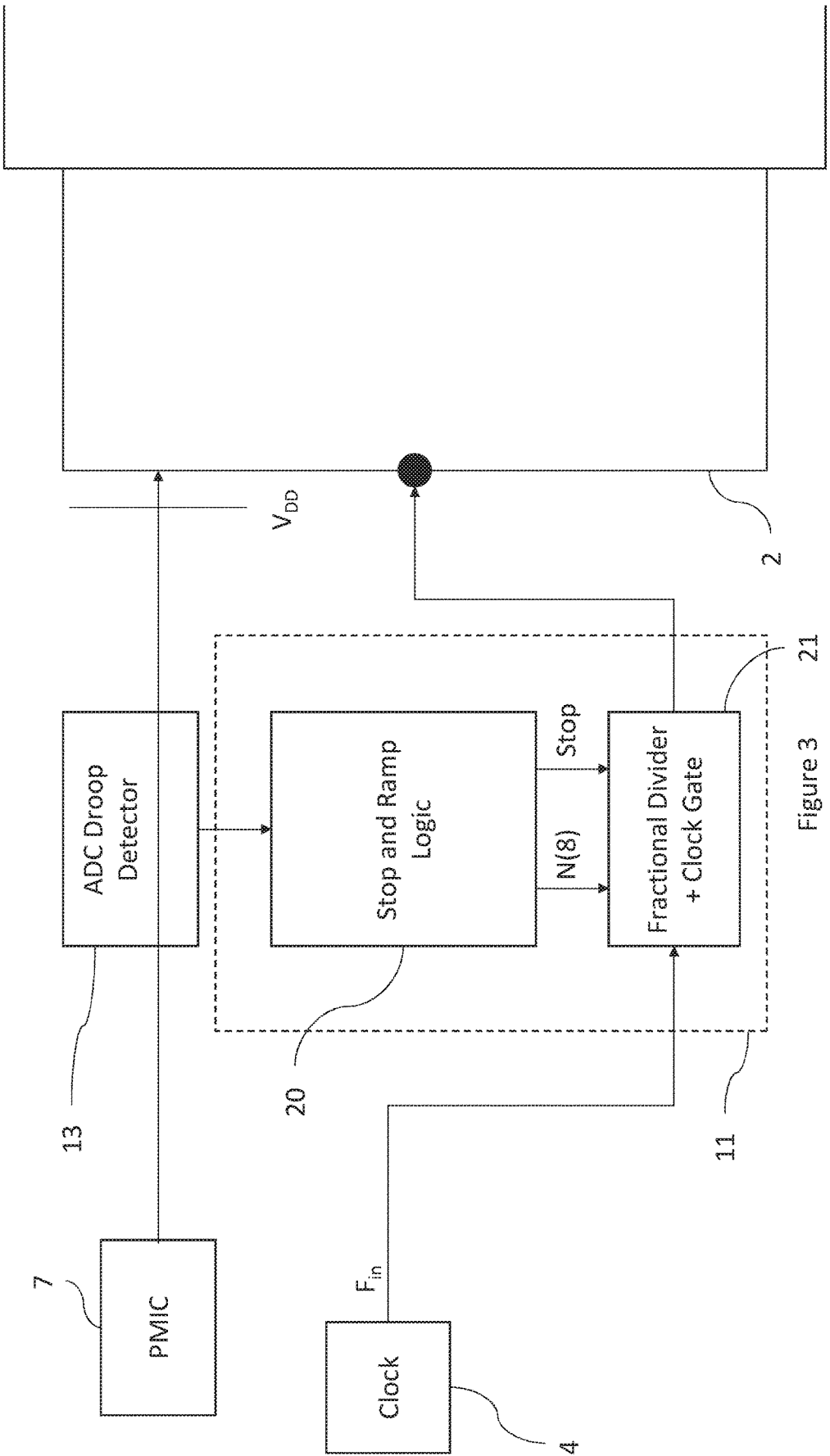
FIG. 3 provides a schematic illustration of the droop detection and mitigation circuitry in which droop is detected by measuring the voltage directly.

Reference is made to FIG. 3, which illustrates the droop mitigation apparatus using a different type of droop detector 13. In this example, the droop detector 13 measures the voltage provided to the processor 2 directly. This droop detector 13 comprises one or more analog to digital convertors that produce measurements of the voltage and report these measurements to the stop and ramp logic 20. The analog to digital convertor, like the tap sampled delay line, provides rapid detection of the droop. However, the tap sampled delay line is a cheaper alternative for detecting the droop. The remaining elements shown in FIG. 3 will operate in the same manner as described above with respect to FIG. 2.

Figure 5:
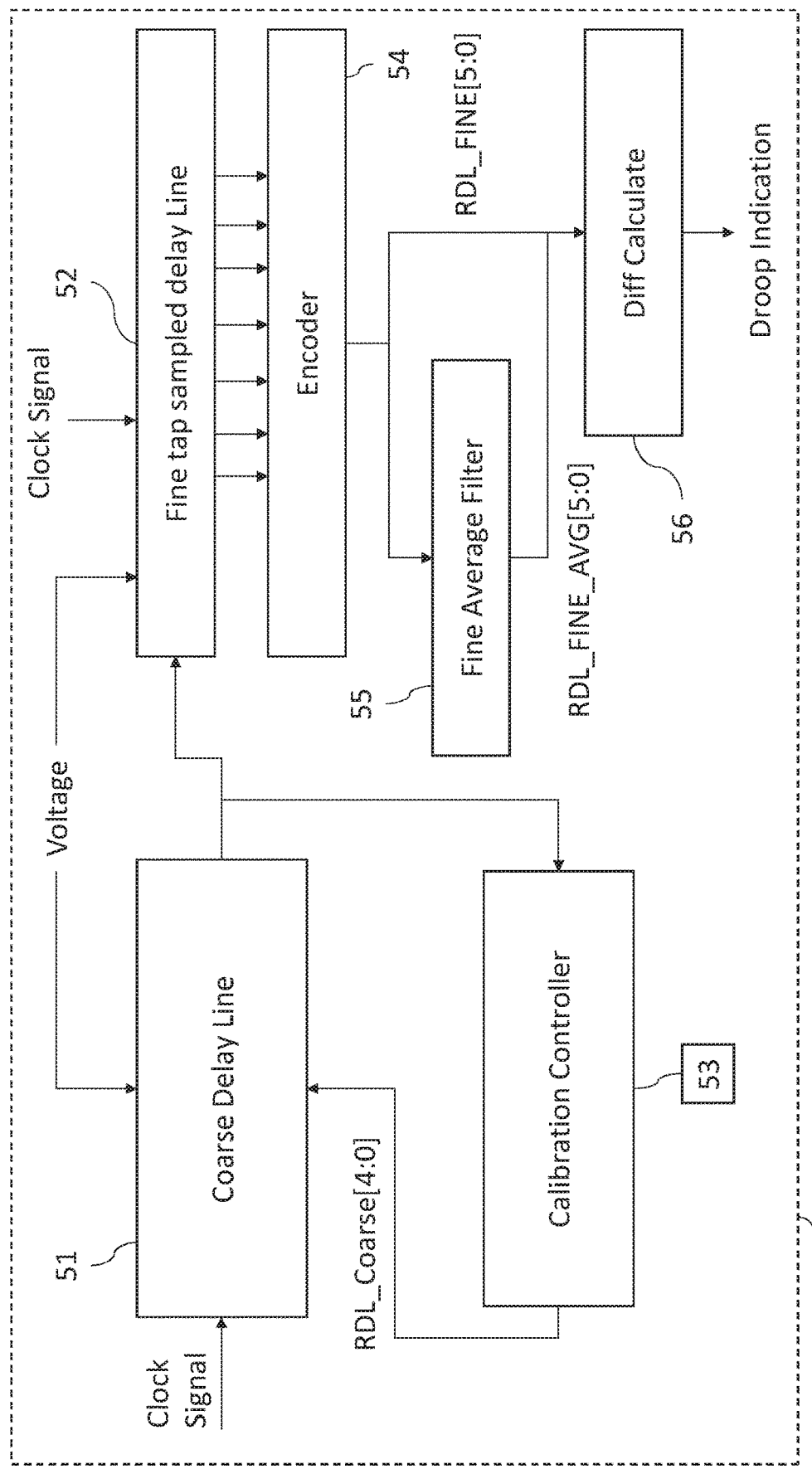
FIG. 5 shows an example of the droop detector for detecting droop by measuring the change in position of a clock signal edge.

Reference is made to FIG. 5, which illustrates an example of a droop detector 13 comprising delay lines for detecting voltage droop. This droop detector 13 measures the droop by measuring a change in position in an edge of a clock pulse (either a rising or falling edge) in a tap sampled delay line 52. The detector 13 includes a coarse delay line 51 in addition to the fine tap sampled delay line 52. These delay lines 51, 52 operate together to measure the position of an edge of the clock signal. The coarse delay line 51 and fine tap sampled delay line 52 are both powered using the same voltage supply that is applied to the processor 2. Therefore, changes in $V_{DD}$ at the processor 2 will coincide with changes in the voltage applied to the coarse delay line 51 and fine tap sampled delay line 52. The delay lines 51, 52 are such that the time taken for a signal to propagate through each stage (i.e. the delay associated with each stage) is dependent upon the voltage supplied to them. The lower the voltage supplied to the delay lines 51, 52, the longer the delay associated with each stage of the delay lines 51, 52. Therefore, since the delay associated with each stage depends upon the supplied voltage, the edge of the clock signal will move in response to a change in the voltage. By measuring the position of the edge of the clock signal and comparing it to an average position, a change in the position of the edge of the clock signal may be detected. The change in the position of the edge of the clock signal indicates a change in $V_{DD}$.

The coarse delay line 51 is configured to introduce a delay into the clock signal by a certain amount. The coarse delay line 51 comprises a plurality of stages, each of which may either be activated to apply a delay to the signal, or not activated so as not to apply such a delay to the signal. For example, the coarse delay line may comprise 32 stages, each of which may introduce a delay to the clock signal of approximately 40 picoseconds. However, the precise amount of the delay depends upon the voltage supplied to the coarse delay line 51. Whether or not each stage is enabled or disabled to introduce its delay is controlled by the calibration controller 53, which outputs an indication of the number of stages in the coarse delay line 51 that are to be active to introduce a delay into the signal. This indication is shown as a 5 bit value 'RDL_Coarse[4:0]' in the Figure.

Figure 6:
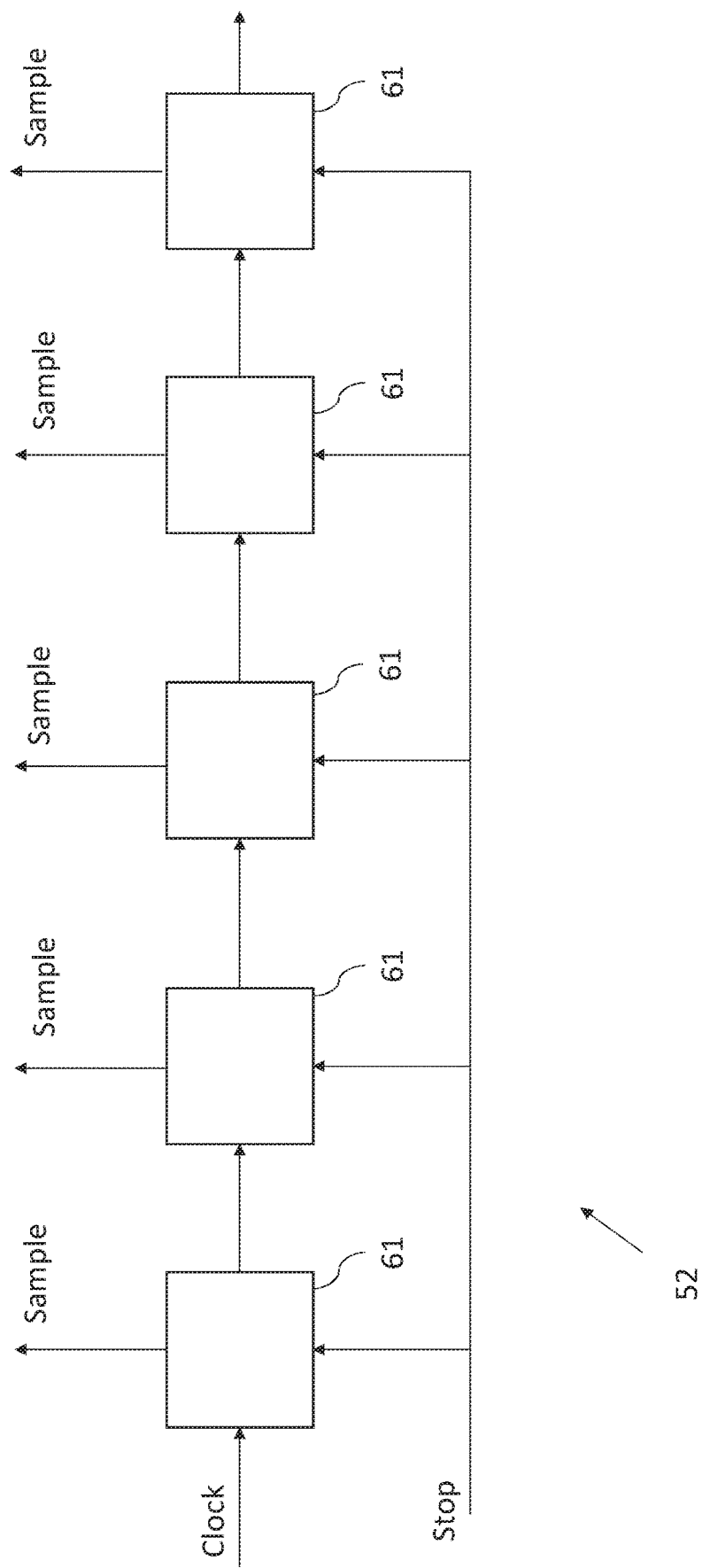
FIG. 6 illustrates a simplified example of a fine tap sampled delay line for detecting the position of a clock signal edge.

The fine tap sampled delay line 52 comprises a plurality of stages, each of which introduces a delay into the clock signal. The clock signal is extracted from the fine tap sampled delay line 52 at least once at each stage, such that different samples of the clock signal at different points in time are extracted. Reference is made to FIG. 6, which illustrates a simplified example of a tap sampled delay line 52. The tap sampled delay line 52 comprises a series of stages 61, each of which introduces a delay of a predefined magnitude into the clock signal. Each of the stages may introduce a delay of 10 picoseconds into the clock signal. Each of the stages 61 may comprise a flip flop that is configured to receive the clock signal, temporarily hold the value of the clock signal upon receipt, and output the clock signal with a predefined delay after receipt. Each flip flop 61 outputs a value of the clock signal it is currently holding when it receives a signal (the stop signal). In response to the stop signal, each stage 61 outputs the value of the clock signal it holds, such that samples of the clock signal at different points in the signal are produced.

In the fine tap sampled delay line 52, the stop signal depends upon the output of the coarse delay line 51. The coarse delay line 51 delays the clock signal by an amount such that, when the delayed clock signal from the coarse delay line 51 is used as the stop signal in the fine tap sampled delay line 52, the original clock signal is sampled at an appropriate point in time to capture the clock edge and allow its position to be detected.

Figure 7:
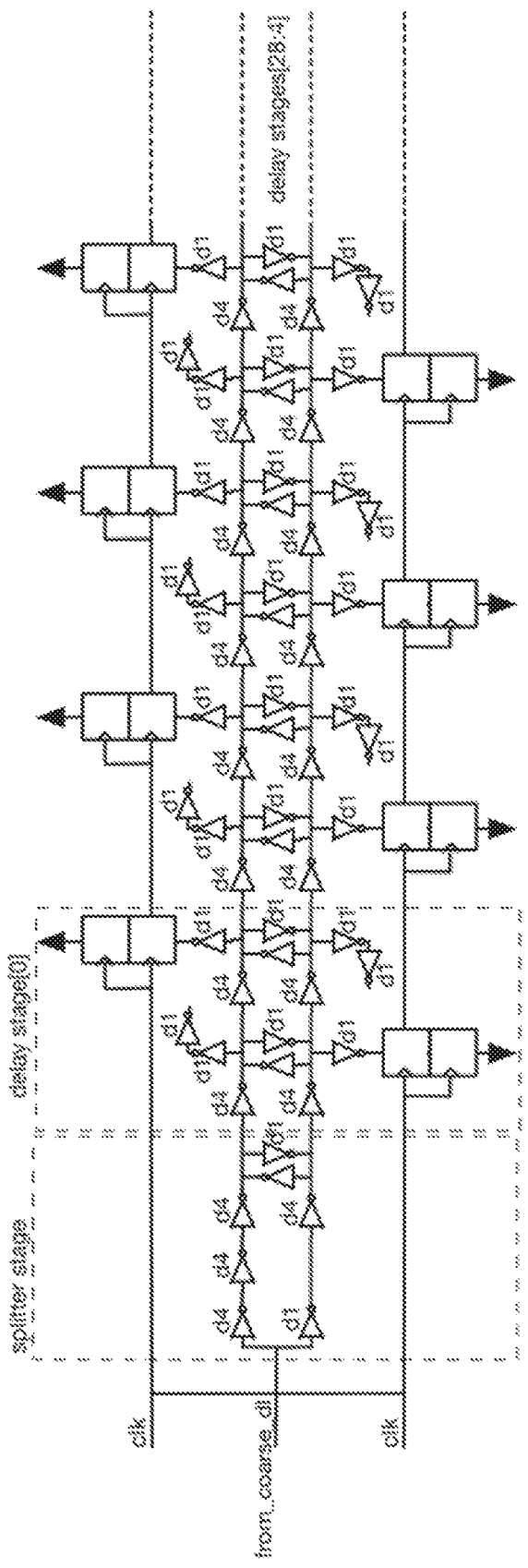
FIG. 7 illustrates an example of a fine tap sampled delay line for detecting the position of a clock signal edge.

Reference is made to FIG. 7, which illustrates in more detail, an example as to how the fine tap sampled delay line 52 may operate. In this example, each delay stage includes two taps, and from each tap a sample is obtained. The output from the coarse sample delay line 51 is split along two paths to produce two different stop signals that determine when the samples are taken. The stop signals along the two paths and manipulated using different combinations of NOT gates to extract samples at different times. Therefore, in this example, there are 32 delay stages, which produce 64 different samples of the clock signal at different times.

Referring again to FIG. 5, the output of the fine tap sampled delay line 52 is provided to an encoder 54, which is configured to determine based on the output of the fine tap sampled delay line 52, the position of the clock edge. The position of the clock edge is determined from the output of the fine tap sampled delay line 52 by examining the samples to determine between which of the two samples a transition between a high (i.e. 1) and a low (i.e. 0) occurs in the signal.

The clock edge is then determined to be between these two points. The output of the encoder 54 (shown as RDL_FINE [5:0]) indicates the position of the clock edge. Since the fine tap sampled delay line 52 outputs 64 samples, the output contains 6 bits, with these bits indicating in which gap between two samples, the clock edge occurred.

The output indicating the position of the clock edge is provided to the fine average filter 55. The fine average filter 55 receives different output values from the encoder 54 and averages these values over time to produce an average value (shown as RDL_FINE_AVG[5:0]) for a detected position of the clock edge. The average value output by the filter is updated each time a new clock edge position value is output by the encoder 54. The average value output by filter 55 is provided to the difference calculation circuitry 56, which determines the difference between the clock edge position and the average clock edge position. This difference represents the shift in the clock edge caused by the magnitude of the droop. The difference indicates the magnitude of the droop.

This droop indication is provided by the droop detector to the stop and ramp logic 20 as shown in FIG. 2.

Figure 8:
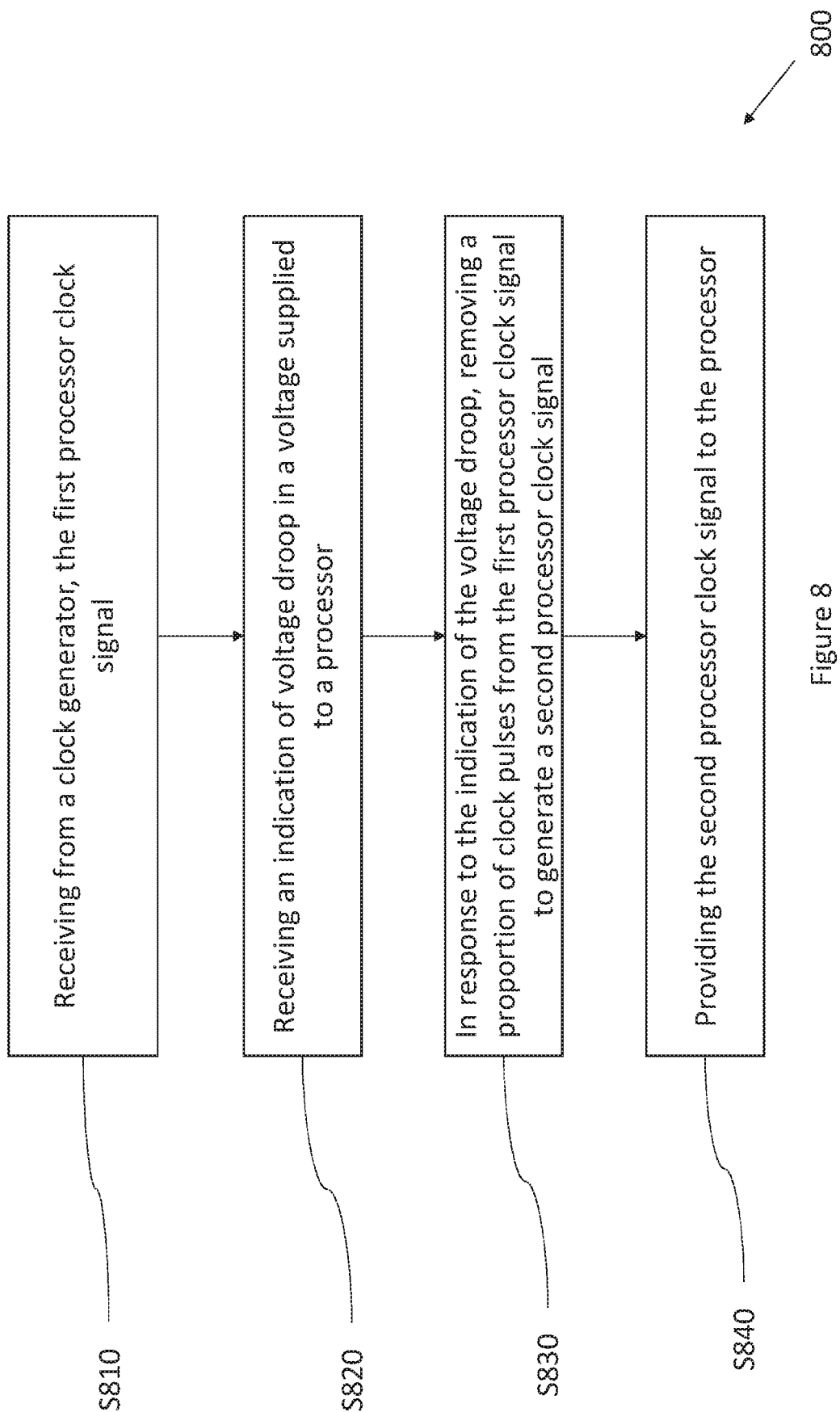
FIG. 8 illustrates an example of a method according to embodiments of the application.

Reference is made to FIG. 8, which illustrates a method 800 according to example embodiments.

At S810, the droop mitigation circuitry receives from a clock signal generator, the first processor clock signal.

At S820, the droop mitigation circuitry receives from the droop detector, an indication of voltage droop in $V_{DD}$.

At S830, in response to the indication of the voltage droop, the droop mitigation circuitry removes a proportion of clock pulses from the first processor clock signal to generate a second processor clock signal.

At S840, the droop mitigation circuitry provides the second processor clock signal to the processor.

While particular embodiments have been described, other applications and variants of the disclosed techniques may become apparent to a person skilled in the art once given the disclosure herein. More generally, according to a first aspect disclosed herein, there is provided a method of controlling the frequency of a clock signal for a processor, the method comprising: receiving from a clock generator, a first processor clock signal for supplying to a processor, the first processor clock signal being of a first frequency; receiving an indication of voltage droop in a voltage supplied to the processor; in response to the indication of the voltage droop, removing a proportion of clock pulses from the first processor clock signal to generate a second processor clock signal of a second frequency, wherein the second frequency is lower than the first frequency; and providing the second processor clock signal to the processor.

In some embodiments, the step of, in response to the indication of the voltage droop, removing a proportion of clock pulses comprises: determining from the indication of the voltage droop that the voltage droop exceeds a predefined threshold; and in response to the voltage droop exceeding the predefined threshold, performing the removing the proportion of clock pulses.

In some embodiments, the method comprises, following the step of removing the proportion of clock pulses from the first processor clock signal, adjusting the second processor clock signal so as to increase the second frequency, the adjusting the second processor clock signal comprising decreasing the proportion of clock pulses removed from the first processor clock signal.

In some embodiments, the second frequency $F_{out}$ is related to the first frequency $F_{in}$ by:

$$F_{out} = \frac{N}{256}F_{in}$$

wherein N is an integer.

In some embodiments, the proportion of clock pulses is dependent upon a magnitude of the voltage droop contained in the indication of voltage droop in the voltage supplied to the processor.

In some embodiments, the method comprises, in response to the indication of the voltage droop and, prior to the step of removing the proportion of clock pulses, block the first clock signal from being supplied to the processor for a predefined number of clock pulses of the first clock signal.

In some embodiments, the method comprises measuring a supply voltage to produce the indication of the voltage droop.

In some embodiments, the step of measuring the supply voltage comprises using an analog to digital convertor to measure the supply voltage.

In some embodiments, the step of detecting voltage droop in the supply voltage comprises using a tap sampled delay line to measure a change in a clock edge position of the first clock signal in the tap sampled delay line, wherein the tap sampled delay line is powered by a same power supply that supplies the voltage to the processor.

In some embodiments, the step of detecting voltage droop in the supply voltage comprises: using a further delay line to delay the first clock signal to produce a delayed clock signal, wherein the further delay line is powered by a same power supply that supplies the voltage to the processor; and using the delayed clock signal to determine when to sample the first clock signal in the tap sample delay line to make a measurement of the clock edge position.

In some embodiments, the method comprises receiving the second clock signal at the processor; propagating the second clock signal along copper wires of the processor for clocking one or more components of the processor.

In some embodiments, the copper wires have a thickness of greater than 0.2 micrometres.

In some embodiments, the one or more components of the processor comprise a plurality of processing units.

According to a second aspect, there is provided a computer system comprising droop mitigation circuitry: comprising controller circuitry and clock signal modification circuitry, the clock signal modification circuitry configured to receive from a clock generator, a first processor clock signal for supplying to a processor, the first processor clock signal being of a first frequency, wherein the controller circuitry is configured to receive an indication of voltage droop in a voltage supplied to the processor, wherein the clock signal modification circuitry is configured to: in response to the indication of the voltage droop received at the controller circuitry, remove a proportion of clock pulses from the first processor clock signal to generate a second processor clock signal of a second frequency, wherein the second frequency is lower than the first frequency; and provide the second processor clock signal to the processor.

In some embodiments, the controller circuitry is configured to: determine from the indication of the voltage droop that the voltage droop exceeds a predefined threshold; and in response to the determination that the threshold is exceeded, provide an indication that the threshold is exceeded to the clock signal modification circuitry, wherein the step of, in response to the indication of the voltage droop received at the controller circuitry, remove the proportion of clock pulses comprises the clock signal modification circuitry removing the proportion of clock pulses in response to the received indication that the threshold is exceeded.

In some embodiments, the indication that the threshold is exceeded comprises an indication of the proportion of clock pulses.

In some embodiments, the computer system comprises a droop detector configured to measure a supply voltage to produce the indication of the voltage droop.

In some embodiments, the droop detector comprises one or more analog to digital convertors configured to measure the supply voltage droop.

In some embodiments, the droop detector comprises a tap sampled delay line configured to measure the voltage droop by measuring a change in a clock edge position of the first clock signal in the tap sampled delay line, wherein the tap sampled delay line is powered by a same power supply that supplies the voltage to the processor.

In some embodiments, the processor is configured to: receive the second clock signal; and propagate the second clock signal along copper wires of the processor for clocking one or more components of the processor.

In some embodiments, the droop mitigation circuitry is located at an entry point of the second clock signal to the processor.

The invention claimed is:

1. A method of controlling the frequency of a clock signal for a processor, the method comprising:
    receiving from a clock generator, a first processor clock signal for supplying to a processor, the first processor clock signal being of a first frequency;
    receiving an indication of voltage droop in a voltage supplied to the processor;
    in response to the indication of the voltage droop, blocking the first processor clock signal from being supplied to the processor for a predefined number of clock pulses of the first processor clock signal;
    subsequently, in response to the indication of the voltage droop, removing a proportion of clock pulses from the first processor clock signal to generate a second processor clock signal of a second frequency, wherein the second frequency is lower than the first frequency; and
    providing the second processor clock signal to the processor.

2. The method as claimed in claim 1, wherein the step of, in response to the indication of the voltage droop, removing a proportion of clock pulses comprises:
    determining from the indication of the voltage droop that the voltage droop exceeds a predefined threshold; and
    in response to the voltage droop exceeding the predefined threshold, performing the removing the proportion of clock pulses.

3. The method as claimed in claim 1, wherein the method comprises, following the step of removing the proportion of clock pulses from the first processor clock signal, adjusting the second processor clock signal to increase the second frequency, the adjusting the second processor clock signal comprising decreasing the proportion of clock pulses removed from the first processor clock signal.

4. The method as claimed in claim 1, wherein the second frequency $F_{out}$ is related to the first frequency $F_{in}$ by:

$$F_{out} = \frac{N}{256} F_{in}$$

wherein N is an integer.

5. The method as claimed in claim 1, wherein the proportion of clock pulses is dependent upon a magnitude of the voltage droop contained in the indication of voltage droop in the voltage supplied to the processor.

6. The method as claimed in claim 1, wherein the method comprises measuring a supply voltage to produce the indication of the voltage droop.

7. The method as claimed in claim 6, wherein the step of measuring the supply voltage comprises using an analog to digital convertor to measure the supply voltage.

8. The method as claimed in claim 1, wherein the step of detecting voltage droop in the supply voltage comprises using a tap sampled delay line to measure a change in a clock edge position of the first clock signal in the tap sampled delay line, wherein the tap sampled delay line is powered by a same power supply that supplies the voltage to the processor.

9. The method as claimed in claim 8, wherein the step of detecting voltage droop in the supply voltage comprises:
    using a further delay line to delay the first clock signal to produce a delayed clock signal, wherein the further delay line is powered by a same power supply that supplies the voltage to the processor; and
    using the delayed clock signal to determine when to sample the first clock signal in the tap sample delay line to make a measurement of the clock edge position.

10. The method as claimed in claim 1, comprising receiving the second clock signal at the processor;
    propagating the second clock signal along copper wires of the processor for clocking one or more components of the processor.

11. The method as claimed in claim 10, wherein the copper wires have a thickness of greater than 0.2 micrometres.

12. The method as claimed in claim 10, wherein the one or more components of the processor comprise a plurality of processing units.

13. A computer system comprising droop mitigation circuitry:
    comprising controller circuitry and clock signal modification circuitry, the clock signal modification circuitry configured to receive from a clock generator, a first processor clock signal for supplying to a processor, the first processor clock signal being of a first frequency;
    wherein the controller circuitry is configured to receive an indication of voltage droop in a voltage supplied to the processor,
    wherein the clock signal modification circuitry is configured to:
        in response to the indication of the voltage droop, block the first processor clock signal from being supplied to the processor for a predefined number of clock pulses of the first processor clock signal;
        subsequently, in response to the indication of the voltage droop received at the controller circuitry, remove a proportion of clock pulses from the first processor clock signal to generate a second processor clock signal of a second frequency, wherein the second frequency is lower than the first frequency; and provide the second processor clock signal to the processor.

14. The computer system as claimed in claim 13, wherein the controller circuitry is configured to:

determine from the indication of the voltage droop that the voltage droop exceeds a predefined threshold; and in response to the determination that the threshold is exceeded, provide an indication that the threshold is exceeded to the clock signal modification circuitry, wherein the step of, in response to the indication of the voltage droop received at the controller circuitry, remove the proportion of clock pulses comprises the clock signal modification circuitry removing the proportion of clock pulses in response to the received indication that the threshold is exceeded.

15. The computer system as claimed in claim 13, wherein the controller circuitry is configured to: in response to the determination that the threshold is exceeded, provide an indication that the threshold is exceeded to the clock signal modification circuitry, wherein the indication that the threshold is exceeded comprises an indication of the proportion of clock pulses.

16. The computer system as claimed in claim 13, wherein the computer system comprises a droop detector configured to measure a supply voltage to produce the indication of the voltage droop.

17. The computer system as claimed in claim 16, wherein the droop detector comprises one or more analog to digital convertors configured to measure the supply voltage droop.

18. The computer system as claimed in claim 16, wherein the droop detector comprises a tap sampled delay line configured to measure the voltage droop by measuring a change in a clock edge position of the first clock signal in the tap sampled delay line, wherein the tap sampled delay line is powered by a same power supply that supplies the voltage to the processor.

19. The computer system as claimed in claim 13, comprising the processor configured to:

receive the second clock signal; and propagate the second clock signal along copper wires of the processor for clocking one or more components of the processor.

20. The computer system as claimed in claim 19, wherein the droop mitigation circuitry is located at an entry point of the second clock signal to the processor.

* * * * *